US007893348B2

(12) United States Patent
Korevaar et al.

(10) Patent No.: US 7,893,348 B2
(45) Date of Patent: *Feb. 22, 2011

(54) NANOWIRES IN THIN-FILM SILICON SOLAR CELLS

(75) Inventors: Bastiaan Arie Korevaar, Schenectady, NY (US); Loucas Tsakalakos, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 964 days.

This patent is subject to a terminal disclaimer.

(21) Appl. No.: 11/509,886

(22) Filed: Aug. 25, 2006

(65) Prior Publication Data

US 2008/0047604 A1    Feb. 28, 2008

(51) Int. Cl.
H01L 31/00 (2006.01)

(52) U.S. Cl. ........................ 136/255; 136/258; 136/261; 257/431; 257/461; 257/465; 977/712; 977/720; 977/762; 977/948; 977/954

(58) Field of Classification Search ............... 136/243, 136/258, 263, 264, 255, 261; 257/292, 293, 257/431, 461, 465; 977/712, 720, 762, 948, 977/954

See application file for complete search history.

(56) References Cited

U.S. PATENT DOCUMENTS

| 6,441,395 | B1 * | 8/2002 | Yu et al. ........................ 257/40 |
| 6,784,361 | B2 * | 8/2004 | Carlson et al. ............... 136/258 |
| 6,878,871 | B2 | 4/2005 | Scher et al. |
| 2004/0003839 | A1 | 1/2004 | Curtin |
| 2004/0109666 | A1 * | 6/2004 | Kim, II ........................ 385/147 |
| 2005/0022856 | A1 * | 2/2005 | Komatsu et al. ............. 136/243 |
| 2005/0072456 | A1 * | 4/2005 | Stevenson et al. ........... 136/244 |
| 2005/0074915 | A1 * | 4/2005 | Tuttle et al. ................... 438/57 |
| 2005/0121068 | A1 * | 6/2005 | Sager et al. .................. 136/252 |
| 2006/0207647 | A1 * | 9/2006 | Tsakalakos et al. ......... 136/256 |
| 2007/0111368 | A1 * | 5/2007 | Zhang et al. .................. 438/99 |

OTHER PUBLICATIONS

Lim et al., "A novel structure, high conversion efficiency p-SiC/ graded p-SiC/i-Si/n-Si/metal substrate-type amorphous silicon solar cell", J. Appl. Physics 56(20) p. 538-542, Jul. 15, 1984.*
Kim et al. "Transparent conducting aluminum doped zinc oxide thin films for organic light emitting diodes", Appl. Phys. Lett. 76(3), Jan. 17, 2000.*
Lim et. al, "A novel structure, high conversion efficiency p-SiC/ graded p-SiC/i-Si/n-Si/ metal substrate type amorphous silicon solar cell" , J. Appl. Phys. vol. 56 p. 538-541, Jul. 1984.*

(Continued)

*Primary Examiner*—Jeffrey T Barton
*Assistant Examiner*—Devina Pillay
(74) *Attorney, Agent, or Firm*—Paul J. DiConza

(57) ABSTRACT

In some embodiments, the present invention is directed to photovoltaic (PV) devices comprising silicon (Si) nanowires as active PV elements, wherein such devices are typically thin film Si solar cells. Generally, such solar cells are of the p-i-n type and can be fabricated for front and/or backside (i.e., top and/or bottom) illumination. Additionally, the present invention is also directed at methods of making and using such devices, and to systems and modules (e.g., solar panels) employing such devices.

37 Claims, 14 Drawing Sheets

OTHER PUBLICATIONS

Shockley and Queisser, "Detailed Balance Limit of Efficiency of p-n. Junction Solar Cells," J. Appl. Phys., 1961, 32(3), pp. 510-519.

Kerr et al., "Lifetime and Efficiency of Limits of Crystalline Silicon Solar Cells," Proc. 29th IEEE Photovoltaic Specialists Conference, 2002, pp. 438-441.

Peng et al., "Fabrication of Large-Area Silicon Nanowire p-n Junction Diode Arrays," Adv. Mater., 2004, vol. 16, pp. 73-76.

Ji et al., "Silicon Nanostructures by Metal Induced Growth (MIG) for Solar Cell Emitters," Proc. IEEE, 2002, pp. 1314-1317.

Bogart et al., "Diameter-Controlled Synthesis of Silicon Nanowires using Nanoporous Alumina Membrane," Adv. Mater. 17, 114 (2005).

Zhang et al., "Synthesis of Ordered Single Crystal Silicon Nanowire Arrays," Adv. Mater., 2001, 13(16), pp. 1238-1241.

Cheng et al., "Highly Ordered Nanostructures of Single Crystalline GaN Nanowires in Anodic Alumina Membranes," Mater. Sci. & Eng., 2000, A286, pp. 165-168.

Zhang et al., "Fabrication of Highly Ordered InSb Nanowire arrays by Electrodeposition in Porous Anodic Alumina Membranes," J. Electrochem. Soc. 2005, 152 (10), pp. C664-C668.

\* cited by examiner

NANOWIRES IN THIN-FILM SILICON SOLAR CELLS

TECHNICAL FIELD

The present invention relates generally to thin-film photovoltaic devices, and specifically to such photovoltaic devices comprising elongated silicon nanostructures as active elements within the device.

BACKGROUND INFORMATION

Presently, silicon (Si) is the most commonly used material in the fabrication of solar cells, such solar cells being used for converting sunlight into electricity. Single and multi-junction p-n solar cells are used for this purpose, but none are efficient enough to drive down the costs involved in the production and use of this technology. Consequently, competition from conventional sources of electricity precludes the widespread use of such solar cell technology.

The primary loss process in existing solar cells occurs when a photo-excited electron quickly loses any energy it may have in excess of the bandgap due to interactions with lattice vibrations, known as phonons, resulting in increased recombination. This loss alone limits the conversion efficiency of a standard cell to about 44%. Additionally, recombination of photo-generated electrons and holes with trap states in the semiconductor crystal associated with point defects (interstitial impurities), metal clusters, line defects (dislocations), planar defects (stacking faults), and/or grain boundaries reduces the efficiency further. Although this latter reduction in efficiency can be overcome by using other materials with appropriate properties, particularly long diffusion lengths of the photo-generated carriers, this still does not bring this technology to a cost parity with more conventional sources of electricity. Further loss is incurred owing to the fact that semiconductors will not absorb light with energy lower than the bandgap of the material used. With all of the photovoltaic losses taken into account, Shockley and Queisser were able to show that the performance of a single junction cell was limited to just over 30 percent efficiency for an optimal cell with a bandgap of 1.3 electron volts (eV) (Shockley and Queisser, "Detailed Balance Limit of Efficiency of p-n Junction Solar Cells," J. Appl. Phys., 1961, 32(3), pp. 510-519). More recent calculations have shown this "limit efficiency" for a single junction to be 29 percent (Kerr et al., "Lifetime and efficiency of limits of crystalline silicon solar cells," Proc. 29$^{th}$ IEEE Photovoltaic Specialists Conference, 2002, pp. 438-441).

The primary issue with thin film solar cells based on amorphous silicon is that the mobility of the charge carriers is very low—particularly that of the holes. Such hole-mobility is the limiting factor for amorphous silicon thin film solar cells. While the intrinsic layer of such solar cells can be made thinner, which increases the chance for the holes to reach the front of the cell, there is significant loss of absorption. To overcome this loss, tandem and triple junctions may be employed, but this is significantly more complex.

Silicon nanowires have been described in p-n junction diode arrays (Peng et al., "Fabrication of large-Area Silicon Nanowire p-n Junction Diode Arrays," Adv. Mater., 2004, vol. 16, pp. 73-76). Such arrays, however, were not configured for use in photovoltaic devices, nor was it suggested how such arrays might serve to increase the efficiency of solar cells.

Silicon nanostructures have been described in solar cell devices (Ji et al., "Silicon Nanostructures by Metal Induced Growth (MIG) for Solar Cell Emitters," Proc. IEEE, 2002, pp. 1314-1317). In such devices, Si nanowires can be formed, embedded in microcrystalline Si thin films, by sputtering Si onto a nickel (Ni) pre-layer, the thickness of which determines whether the Si nanowires grow inside the film or not. However, such nanowires are not active photovoltaic (PV) elements; they merely serve in an anti-reflective capacity.

Solar cells comprising silicon nanostructures, where the nanostructures are active PV elements, have been described in commonly-assigned co-pending U.S. patent application Ser. No. 11/081,967, filed Mar. 16, 2005. In that particular Application, the charge separating junctions are largely contained within the nanostructures themselves, generally requiring doping changes during the synthesis of such nanostructures.

As a result of the foregoing, any modifications of such technology, particularly modifications incorporating nanoscale materials and devices, that lead to facilitated fabrication and efficiencies on par with the more traditional sources of electricity, would be entirely beneficial.

BRIEF DESCRIPTION OF THE INVENTION

In some embodiments, the present invention is directed to photovoltaic (PV) devices comprising elongated silicon (Si) nanostructures (e.g., nanowires, nanorods, etc.) as active PV elements, wherein such devices are typically thin film Si solar cells. Generally, such solar cells are of the p-i-n type. Additionally, the present invention is also directed at methods of making and using such devices, and to systems and modules (e.g., solar panels) employing such devices. In some such embodiments, the elongated nanostructures enhance the performance of conventional thin film solar cells by increasing the charge collection due to the nanoscale proximity to the film for charge separation. In some such embodiments, the light is primarily absorbed within the thin film materials, rather than within the nanostructures, and the cell is typically designed such that a substantial fraction of the light is absorbed within the intrinsic layer of the thin film cell.

In some embodiments, the present invention is directed to a photovoltaic device comprising: (a) a plurality of Si nanowires (representative elongated nanostructures) disposed in a substantially vertical orientation on a substrate, the Si nanowires having a doping of a first type (p or n); (b) a first conformal Si layer of amorphous (or nanocrystalline) intrinsic silicon disposed conformally about the plurality of Si nanowires, and (optionally) substantially occupying any void space between the plurality of nanowires such that the first conformal Si layer effectively absorbs a majority of light impinging on the photovoltaic device; (c) a second conformal Si layer of semiconducting material disposed conformally about the first conformal Si layer, the second conformal Si layer having a doping of a second type (either p or n, but different from that of the Si nanowires), thereby providing for a charge separating junction; (d) a conductive material layer disposed on the second conformal Si layer; and (e) top and bottom contacts (substrate can comprise the bottom contacts) operable for connecting the device to an external circuit, wherein the bottom contact is in electrical contact with the plurality of nanowires and the top contact is in electrical contact with the second conformal Si layer. In some such embodiments, the photovoltaic device further comprises a nanoporous template, residing on, or integral with, the substrate, and from which the Si nanowires emanate.

In some embodiments, the present invention is directed to a photovoltaic device comprising: (a) a plurality of Si nanowires disposed in a substantially vertical orientation on a substrate, the Si nanowires having a doping of a first type (p or n); (b) a first conformal Si layer of amorphous (or nanocrystalline) intrinsic silicon disposed conformally about the plurality of Si nanowires, and substantially occupying any void space between the plurality of nanowires such that the first conformal Si layer effectively absorbs a majority of light impinging on the photovoltaic device; (c) a second conformal Si layer of semiconducting material disposed conformally about the first conformal Si layer, the second conformal Si layer having a doping of a second type (either p or n, but different from that of the Si nanowires), thereby providing for a charge separating junction; (d) a conductive transparent material disposed on the second conformal Si layer; and (e) top and bottom contacts operable for connecting the device to an external circuit, wherein the bottom contact is in electrical contact with the plurality of nanowires and the top contact is in electrical contact with the second conformal Si layer. In some such embodiments, the photovoltaic device further comprises a nanoporous template, residing on, or integral with, the substrate, and from which the Si nanowires emanate.

In some other embodiments, the present invention is directed to a photovoltaic device comprising: (a) a plurality of Si nanowires disposed in a substantially vertical orientation on a transparent conductive substrate, the Si nanowires having a doping of a first type (p or n); (b) a first conformal Si layer of amorphous (or nanocrystalline) intrinsic silicon disposed conformally about the plurality of Si nanowires, and substantially occupying any void space between the plurality of nanowires such that the first conformal Si layer effectively absorbs a majority of light impinging on the photovoltaic device; (c) a second conformal Si layer of semiconducting material disposed conformally about the first conformal Si layer, the second conformal Si layer having a doping of a second type (either p or n, but different from that of the Si nanowires), thereby providing for a charge separating junction; (d) a conductive material layer (e.g., metal) disposed on the second conformal Si layer such that the transparent conductive substrate and the conductive material layer provide top and bottom electrical contacts for the device. This type of device is generally operable for backside (i.e., through the substrate) illumination.

In some embodiments, the present invention is directed to a method of making a photovoltaic device, the method comprising the steps of: (a) providing Si nanowires on a substrate, wherein the Si nanowires are oriented substantially perpendicular to the plane of the surface, and wherein the Si nanowires have a doping of a first type; (b) depositing a first conformal Si layer of intrinsic silicon conformally about the plurality of nanowires such that any void space between the Si nanowires is substantially filled; (c) depositing a second conformal Si layer about the first conformal Si layer, the second conformal Si layer having a doping of a second type so as to establish a charge separating junction together with the Si nanowires and the first conformal Si layer; (d) depositing a conductive transparent material on the second conformal Si layer; and (e) establishing top and bottom contacts operable for connecting the device to an external circuit, wherein the bottom contact is in electrical contact with the plurality of Si nanowires and the top contact is in electrical contact with the second conformal Si layer.

In some or other embodiments, the present invention is directed to a method of making a photovoltaic device, the method comprising the steps of: (a) providing Si nanowires on a transparent conductive substrate, wherein the Si nanowires are oriented substantially perpendicular to the plane of the surface, and wherein the Si nanowires have a doping of a first type; (b) depositing a first conformal Si layer of intrinsic silicon conformally about the plurality of nanowires such that any void space between the Si nanowires is substantially filled; (c) depositing a second conformal Si layer about the first conformal Si layer, the second conformal Si layer having a doping of a second type so as to establish a charge separating junction together with the Si nanowires and the first conformal Si layer; and (d) depositing a layer of conductive material on the second conformal Si layer; wherein the transparent conductive substrate and the layer of conductive material are operable for establishing top and bottom contacts suitable for connecting the device to an external circuit, wherein the bottom contact is the transparent conductive substrate in electrical contact with the plurality of Si nanowires and the top contact is layer of conductive material in electrical contact with the second conformal Si layer.

In some embodiments, the present invention is directed to assemblies of photovoltaic devices or solar cells (in the form of modules or solar panels), and to the use of such assemblies on building roofs, wherein such assemblies can be connected through an inverter to the electricity grid.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
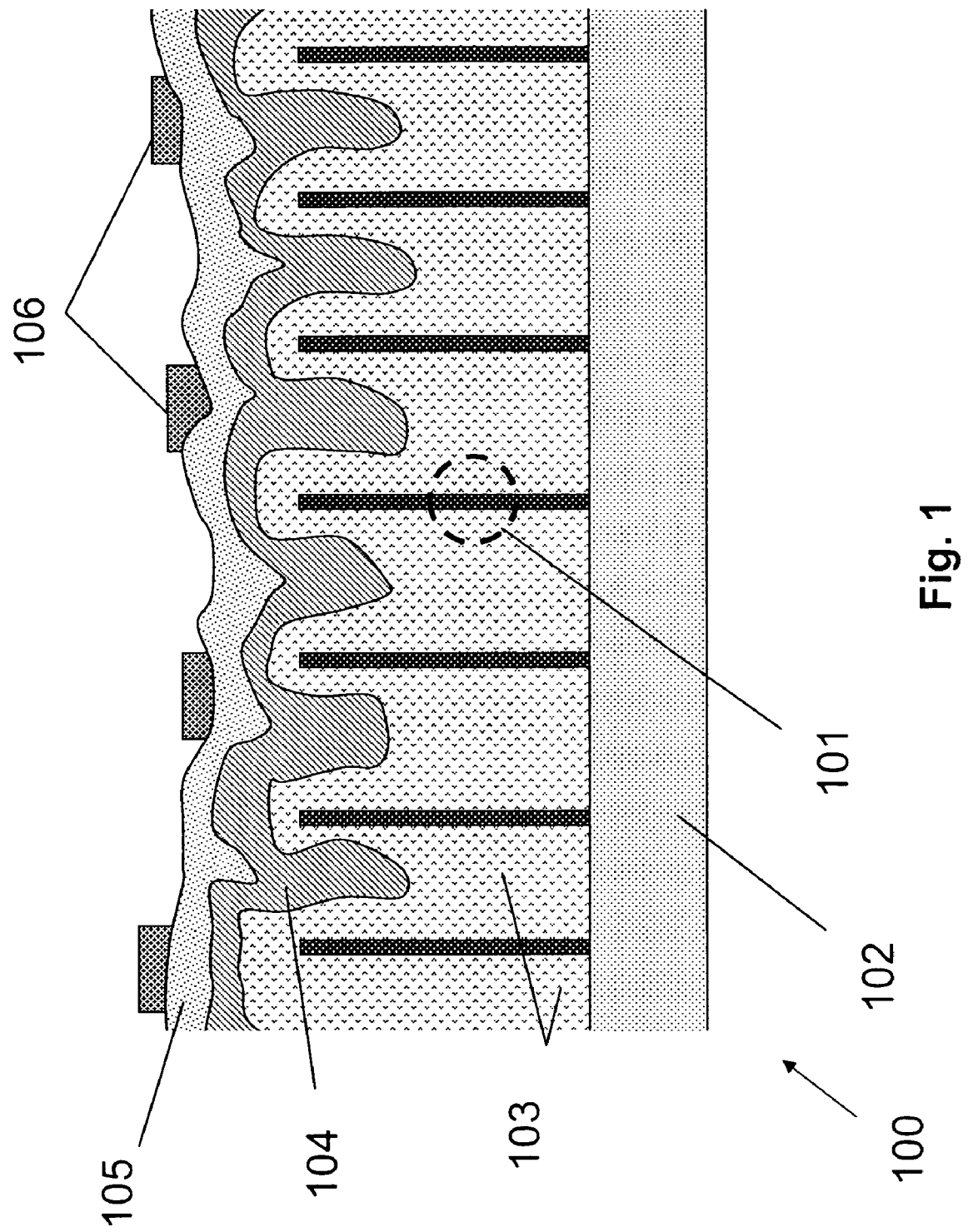
FIG. 1 depicts a thin-film photovoltaic (PV) cell comprising silicon (Si) nanowires, in accordance with some embodiments of the present invention.

In some embodiments, the present invention is directed to photovoltaic (PV) devices comprising silicon (Si) nanowires (or other elongated nanostructures) as active PV elements, wherein such devices are typically thin film Si solar cells. Generally, such solar cells are of the p-i-n type and can be fabricated for front and/or backside (i.e., top and/or bottom) illumination. Additionally, the present invention is also directed at methods of making and using such devices, and to systems and modules (e.g., solar cells) employing such devices.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Referring to the drawings in general, it will be understood that the illustrations are for the purpose of describing a particular embodiment of the invention and are not intended to limit the invention thereto.

While most of the terms used herein will be recognizable to those of skill in the art, the following definitions are nevertheless put forth to aid in the understanding of the present invention. It should be understood, however, that when not explicitly defined, terms should be interpreted as adopting a meaning presently accepted by those of skill in the art.

"Thin-film solar cells," as defined herein, refer to a class of solar cells comprising a light-absorbing layer having a thickness of less than about 20 μm.

"Elongated nanostructures," as defined herein, are nanostructures that are nanoscale in at least two dimensions. Exemplary such elongated nanostructures include, but are not limited to, nanowires, nanorods, nanotubes, and the like.

"Nanowires," as defined herein, are generally elongated nanostructures typically being sub-micron (<1 μm) in at least two dimensions and having a largely cylindrical shape.

"Conformal," as defined herein, pertains to coatings that largely adopt (i.e., conform to) the shape or structure of the structures which they coat. This term should be interpreted broadly, however, permitting the substantial filling of void space between the coated structures—at least in some embodiments.

A "charge separating junction," as defined herein, comprises a boundary between materials of different type (e.g., differing dopants and/or bulk composition) that allows for the separation of electrons and holes.

A "p-i-n photovoltaic device," as defined herein, is a stack of three materials with one layer being doped p-type (primarily hole conduction), one being undoped (i.e., intrinsic), and the other being doped n-type (primarily electron conduction).

"Nanotemplates," as defined herein, are inorganic or organic films comprising an array of pores or columns having nanoscale dimensions.

In some embodiments, the present invention is generally directed to a photovoltaic device comprising: (a) a plurality of Si nanowires disposed in a substantially vertical orientation on a substrate, the Si nanowires having a doping of a first type (p or n); (b) a first conformal Si layer of amorphous (or nanocrystalline) intrinsic silicon disposed conformally about the plurality of Si nanowires, and substantially occupying any void space between the plurality of nanowires such that the first conformal Si layer effectively absorbs a majority of light impinging on the photovoltaic device; (c) a second conformal Si layer of semiconducting material disposed conformally about the first conformal Si layer, the second conformal Si layer having a doping of a second type (either p or n, but different from that of the Si nanowires), thereby providing for a charge separating junction; (d) a conductive material layer disposed on the second conformal Si layer; and (e) top and bottom contacts operable for connecting the device to an external circuit, wherein the bottom contact is in electrical contact with the plurality of nanowires and the top contact is in electrical contact with the second conformal Si layer. In some such embodiments, the photovoltaic device further comprises a nanoporous template, residing on, or integral with, the substrate, and from which the Si nanowires emanate.

Referring to FIG. 1, in some embodiments, the present invention is directed to a photovoltaic device 100 comprising: (a) a plurality of Si nanowires 101 disposed in a substantially vertical orientation on a substrate 102, the Si nanowires having a doping of a first type; (b) a first conformal Si layer 103 of intrinsic silicon disposed conformally about the plurality of Si nanowires 101, and substantially occupying any void space between the plurality of nanowires such that the first conformal Si layer effectively absorbs a majority of any light impinging on the photovoltaic device; (c) a second conformal Si layer 104 of semiconducting material disposed conformally about the first conformal Si layer 103, the second conformal Si layer having a doping of a second type, thereby providing for a charge separating junction; (d) a conductive transparent material 105 disposed on the second conformal Si layer 104; and (e) top (106) and bottom contacts (see FIG. 3, vide infra) operable for connecting the device to an external circuit, wherein the bottom contact is in electrical contact with the plurality of Si nanowires 101 and the top contact is in electrical contact with the second conformal Si layer 104. Note that, as used herein with reference to the placement of the contacts, the terms "top" and "bottom" refer to the interrelationship of the parts shown in the drawings, and do not necessarily coincide with the direction in which the device receives light, as in the use of such devices.

Figure 2:
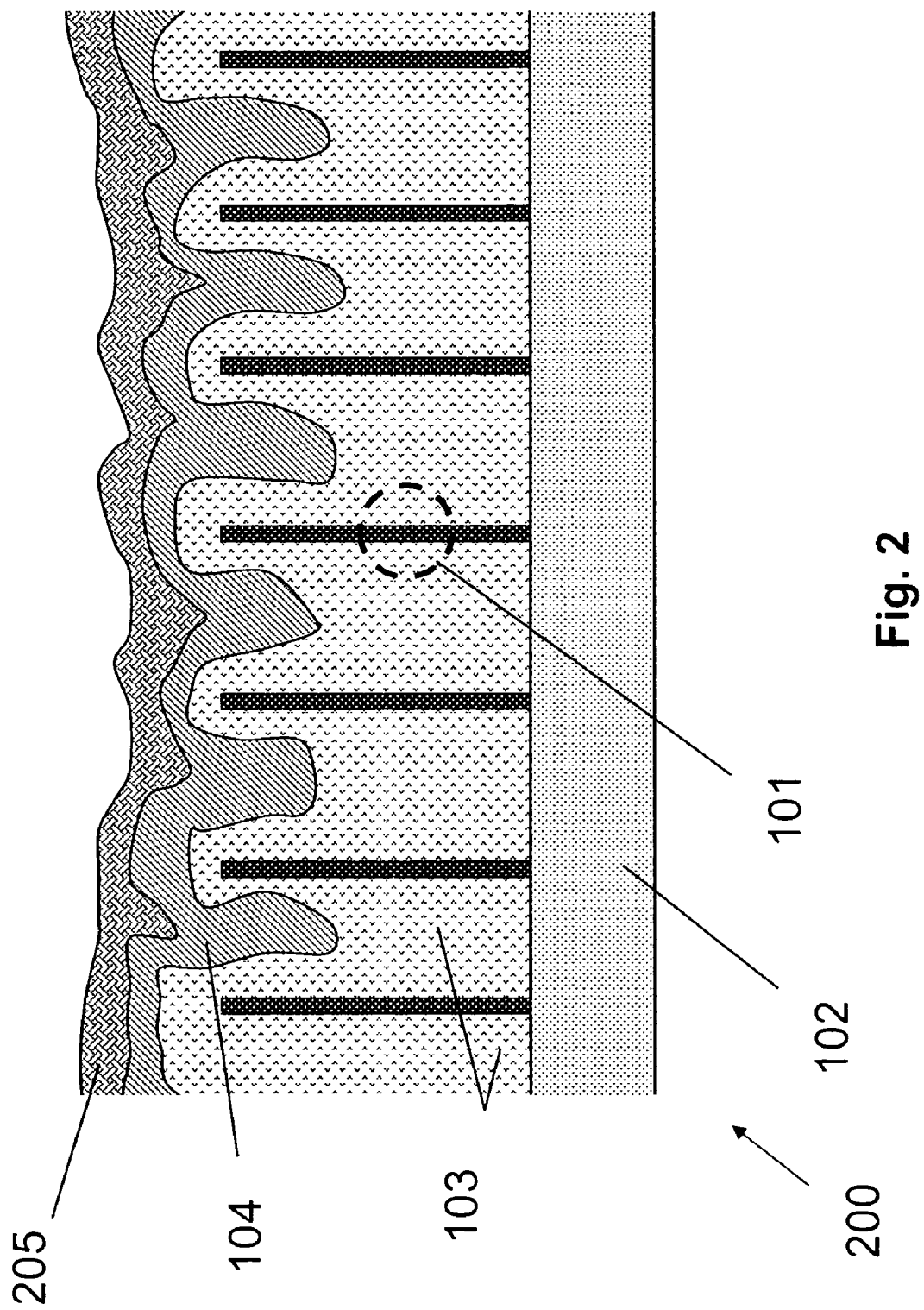
FIG. 2 depicts a thin-film photovoltaic (PV) cell comprising silicon (Si) nanowires, in accordance with some embodiments of the present invention, the cell being operable for illumination through the substrate.

Referring now to FIG. 2, in some or other embodiments, the present invention is directed to a photovoltaic device 200 comprising: (a) a plurality of Si nanowires 101 disposed in a substantially vertical orientation on a transparent conductive substrate 102, the Si nanowires having a doping of a first type (p or n); (b) a first conformal Si layer 103 of amorphous (or nanocrystalline) intrinsic silicon disposed conformally about the plurality of Si nanowires, and substantially occupying any void space between the plurality of nanowires such that the first conformal Si layer effectively absorbs a majority of light impinging on the photovoltaic device; (c) a second conformal Si layer 104 of semiconducting material disposed conformally about the first conformal Si layer, the second conformal Si layer having a doping of a second type (either p or n, but different from that of the Si nanowires), thereby providing for a charge separating junction; (d) a conductive material layer 205 (e.g., metal) disposed on the second conformal Si layer such that the transparent conductive substrate and the conductive material layer provide top and bottom electrical contacts for the device. This type of device is generally operable for backside (i.e., through the substrate) illumination. In some such embodiments, conductive material layer 205 is reflective.

Figure 3:
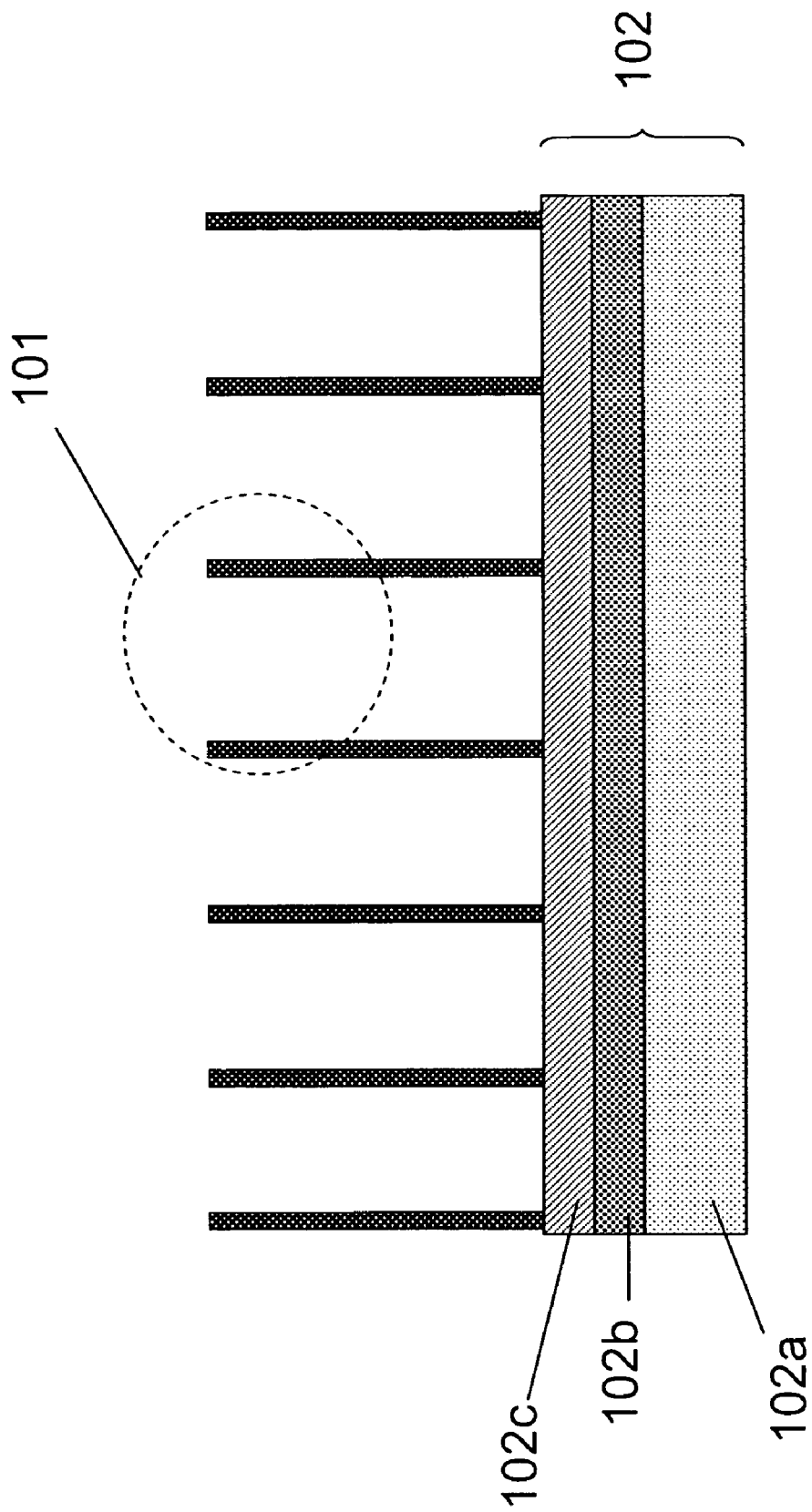
FIG. 3 depicts substrates comprising multiple layers, in accordance with some embodiments of the present invention.

In some of the above device embodiments, substrate 102 comprises subcomponents. Referring to FIG. 3, in some embodiments, the nanowires 101 emanate from a nanoporous template 102c. In some embodiments, a conductive layer 102b (operable as a bottom contact) is disposed on a non-conductive layer 102a. In some such embodiments comprising a bottom non-conductive layer 102a, vias may exist in the active layer to electrically access the bottom contact (e.g., 102b).

Substantially vertical, according to the present invention, means that a majority of the Si nanowires are positioned on the substrate such that their length forms an angle with the substrate surface that is between 45° and 90°. Note, however, that the orientation of the nanowires can be largely random, the primary criteria being that they largely extend into the first conformal layer 103 so as to serve as collection devices for charge carriers and the conformal layer 103 can coat the wires conformally.

As seen in FIG. 3, in some of the above device embodiments, the above-described photovoltaic device further comprises a nanoporous template 102c, residing on, or integral with, the substrate, and from which the Si nanowires emanate. Suitable such templates include, but are not limited to, anodized aluminum oxide (AAO), silicon oxide, silicon nitride, boron nitride, and the like.

Typically, the Si nanowires 101 have a diameter between about 5 nm and about 1 µm, and a length between about 100 nm and about 100 µm. Typically, the Si nanowires are highly crystalline, but may also be comprised of amorphous and/or nanocrystalline Si. Typically, the Si nanowires are p-doped, but other embodiments are contemplated wherein the Si nanowires are n-doped.

In some embodiments, the diameter of the Si nanowires 101 is sufficiently small that they become quantum confined and their bandgap increases as a function of their diameter below a certain threshold (typically around 5 nm). The advantage of this higher bandgap can be multi-fold: (1) there is less absorption of light (and therefore less loss), (2) there is a higher potential Voc for the devices, and (3) bandgap is more optimally adjusted to that of the amorphous material, resulting in less band-bending. Such advantages could lead to an increased efficiency.

In some of the above device embodiments, the substrate 102 comprises a material selected from the group consisting of amorphous Si, amorphous SiGe, amorphous SiC, and the like. In other embodiments, the substrate material is not particularly limited. Generally, the substrate can be any combination of conductive or non-conductive and transparent or non-transparent. In some embodiments, the substrate comprises a transparent conductive oxide material. In some such embodiments, the transparent conductive oxide material is indium-tin-oxide (ITO).

In some of the above device embodiments, the top contacts 106 comprise aluminum or gold with titanium as an adhesive layer, a metal paste as commonly used in the photovoltaics industry, or other suitable contact materials combinations.

Generally, the bottom contact comprises a conductive material. In some embodiments, the bottom contact comprises a metallic thin film selected from the group consisting of Au, Ti, W, Co, Ta$_2$N, or TiN, on a non-conductive substrate. In some embodiments, the bottom contact comprises a material that is transparent, thereby providing for backside illumination. In some such embodiments, the material of which the bottom contact is comprised is both conductive and transparent, such as doped ZnO. In some embodiments, this material is the substrate 102 (e.g., as in embodiments utilizing a metal foil substrate), in others it is a layered portion of the substrate (e.g., conduction layer 102b).

As mentioned above, the first conformal layer 103 is generally an intrinsic Si. Typically, this layer can comprise amorphous or nanocrystalline Si. Typically, the first conformal layer 103 has a thickness between about 50 nm and about 1 µm.

Typically, the second conformal layer 104 is n-doped. However, embodiments are contemplated where the second conformal layer is p-doped (in case the nanostructures are n-doped). To provide for a charge-separating junction, however, it is important that when the nanowires are p-doped the second conformal layer be n-doped and vice versa. Typically, this layer can comprise amorphous or nanocrystalline Si. Typically, the second conformal layer 104 has a thickness between about 5 nm and about 100 nm.

In some embodiments, the conductive transparent material 105 is a transparent conductive oxide. In some such embodiments, the transparent conductive oxide is indium-tin-oxide (ITO) or ZnO or other TCO such as is known and used in the art. Typically, the conductive transparent material has a thickness between about 50 nm and about 1 µm.

Regarding device embodiments having a transparent conductive substrate and a conductive material layer 205, in some such embodiments, the conductive material layer 205 comprises a metal such as, but not limited to, Mo, Al, Cu, Ag, Ti, and the like. Conductive material layer 205 typically has a thickness between about 100 nm and about 5 µm. Generally, material reflectivity is an important criterion for this layer.

Figure 4:
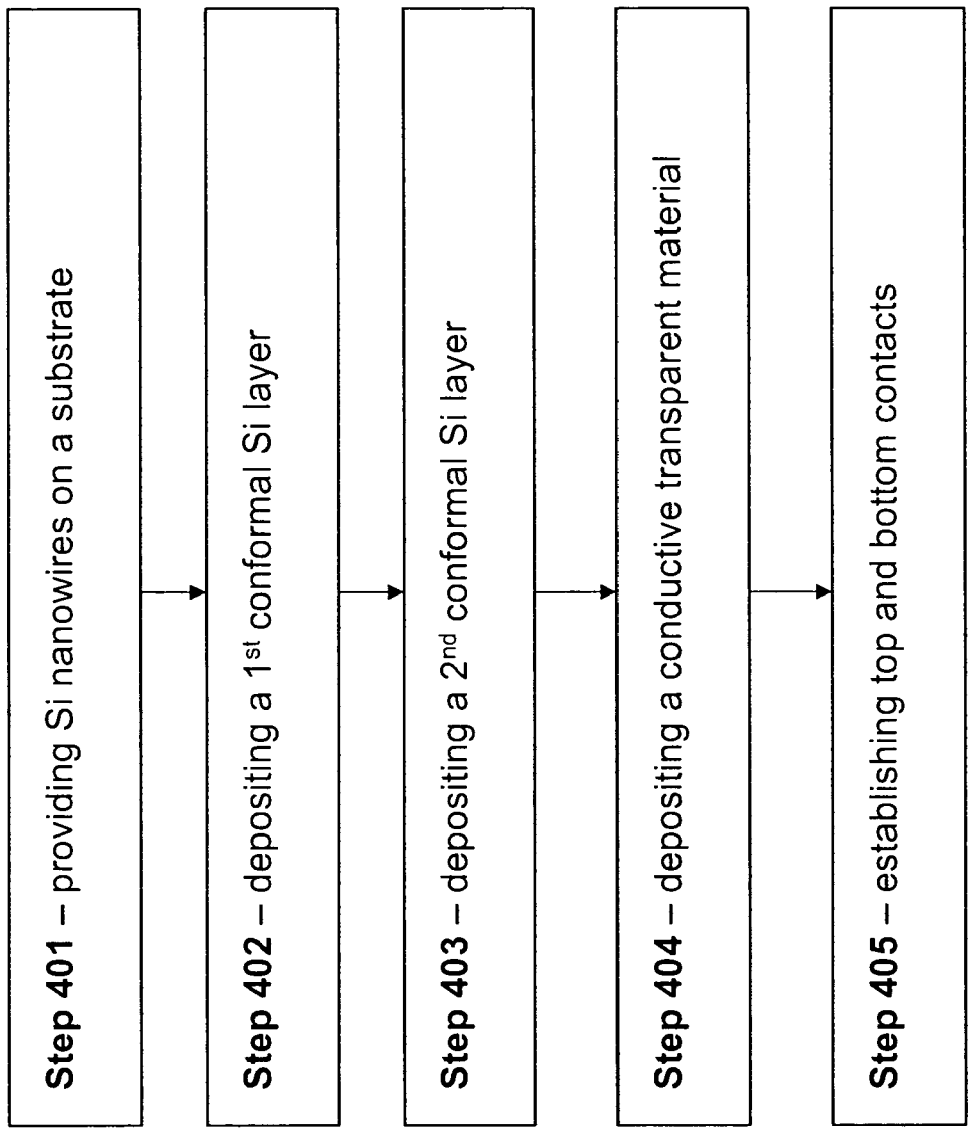
FIG. 4 illustrates, in stepwise fashion, a method for fabricating a thin-film photovoltaic cell comprising Si nanowires, in accordance with some embodiments of the present invention.

Referring to FIG. 4, in some embodiments, the present invention is directed to a method of making a photovoltaic device, the method comprising the steps of: (Step 401) providing Si nanowires on a substrate, wherein the Si nanowires are oriented substantially perpendicular to the plane of the surface, and wherein the Si nanowires have a doping of a first type; (Step 402) depositing a first conformal Si layer of intrinsic silicon conformally about the plurality of nanowires such that any void space between the Si nanowires is substantially filled; (Step 403) depositing a second conformal Si layer about the first conformal Si layer, the second conformal Si layer having a doping of a second type so as to establish a charge separating junction together with the Si nanowires and the first conformal Si layer; (Step 404) depositing a conductive transparent material on the second conformal Si layer; and (Step 405) establishing top and bottom contacts operable for connecting the device to an external circuit, wherein the bottom contact is in electrical contact with the plurality of Si nanowires and the top contact is in electrical contact with the second conformal Si layer.

Figure 5:
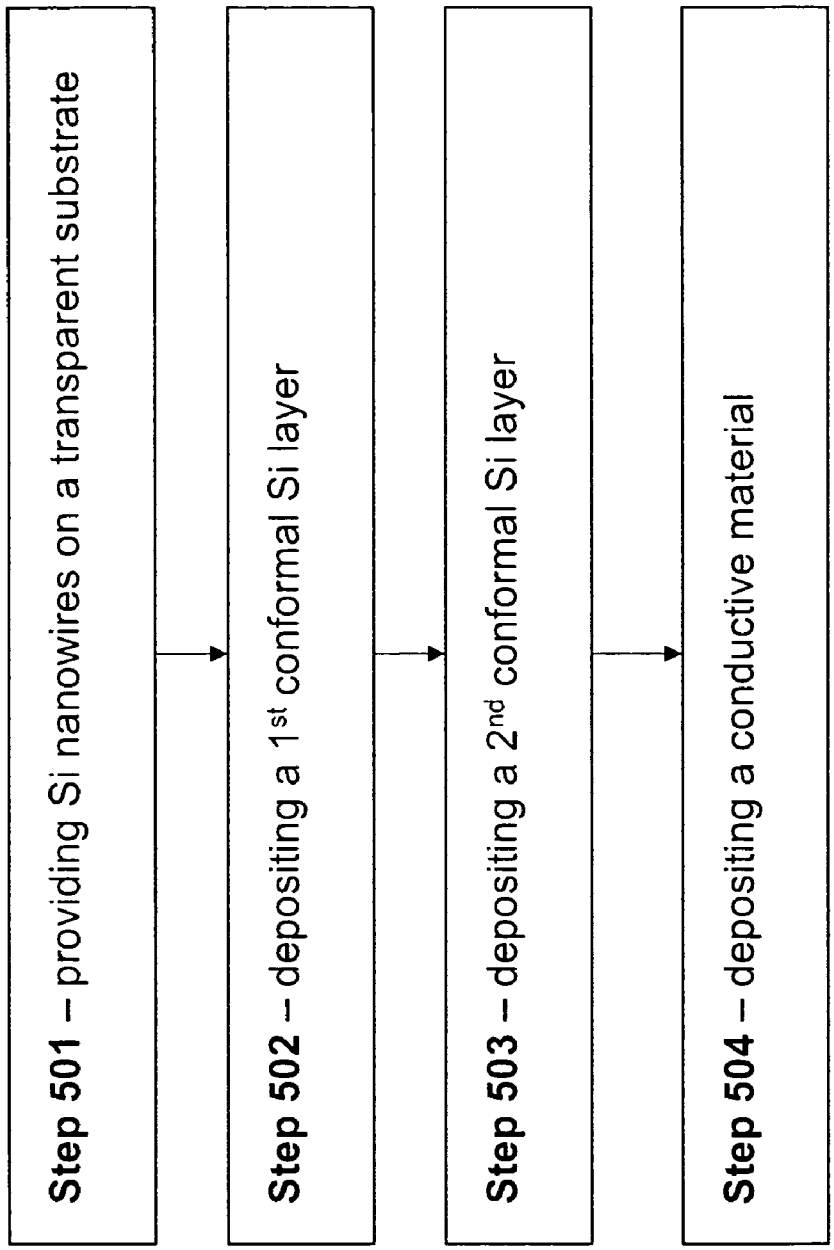
FIG. 5 illustrates, in stepwise fashion, a method for fabricating a thin-film photovoltaic cell comprising Si nanowires, in accordance with some embodiments of the present invention, the cell being operable for illumination through the a transparent substrate.

Referring to FIG. 5, in some or other embodiments, the present invention is directed to a method of making a photovoltaic device, the method comprising the steps of: (Step 501) providing Si nanowires on a transparent conductive substrate, wherein the Si nanowires are oriented substantially perpendicular to the plane of the surface, and wherein the Si nanowires have a doping of a first type; (Step 502) depositing a first conformal Si layer of intrinsic silicon conformally about the plurality of nanowires such that any void space between the Si nanowires is substantially filled; (Step 503) depositing a second conformal Si layer about the first conformal Si layer, the second conformal Si layer having a doping of a second type so as to establish a charge-separating junction together with the Si nanowires and the first conformal Si layer; and (Step 504) depositing a layer of conductive material (conductive material layer) on the second conformal Si layer; wherein the transparent conductive substrate and the layer of conductive material are operable for establishing top and bottom contacts suitable for connecting the device to an external circuit, wherein the bottom contact is the transparent conductive substrate in electrical contact with the plurality of Si nanowires and the top contact is layer of conductive material in electrical contact with the second conformal Si layer.

In some embodiments, the nanowires are grown by a method selected from the group consisting of chemical vapor deposition (CVD), metal-organic chemical vapor deposition (MOCVD), plasma-enhanced chemical vapor deposition (PECVD), hot wire chemical vapor deposition (HWCVD), critical point solution deposition, atomic layer deposition, electrochemical deposition, solution chemical deposition, and combinations thereof.

In some embodiments, the Si nanowires are grown from a nanoporous template such as AAO (see above). In some such embodiments, an etching step is employed to etch back or completely remove the template after growth. CVD growth of nanowires in AAO templates is described in Bogart et al., "Diameter-controlled synthesis of silicon nanowires using nanoporous alumina membrane," Adv. Mater. 17, 114 (2005). Electrochemical growth of nanowires in AAO templates is generally described in commonly assigned co-pending U.S. patent application Ser. No. 11/141,613, filed May 27, 2005. For other methods of generating such elongated nanostructures, see Zhang et al., "Synthesis of Ordered Single Crystal Silicon Nanowire Arrays," Adv. Mater., 2001, 13(16), pp. 1238-1241; Cheng et al., "Highly ordered nanostructures of single crystalline GaN nanowires in anodic alumina membranes," Mater. Sci. & Eng., 2000, A286, pp. 165-168; and Zhang et al., "Fabrication of Highly Ordered InSb Nanowire arrays by Electrodeposition in Porous Anodic Alumina Membranes," J. Electrochem. Soc., 2005, 152(10), pp. C664-C668.

In some embodiments, the nanowires are catalytically grown from metal nanoparticles and/or thin metal films. In some such embodiments, the metal nanoparticles reside in a nanoporous template. In some such embodiments, the metal nanoparticles comprise a metal selected from the group consisting of gold (Au), indium (In), gallium (Ga), iron (Fe), and combinations thereof.

Doping of the nanowires (and also the second conformal layer) is typically achieved by introducing a suitable gas or liquid (e.g., trimethylboron, $B(CH_3)_3$, or diborane ($B_2H_6$) for p-type doping and phosphine ($PH_3$) for n-type doping), during the growth process.

In some embodiments, the first and/or second conformal Si layers are deposited by a method selected from the group consisting of CVD, MOCVD, PECVD, HWCVD, sputtering, electrochemical deposition, evaporation, and combinations thereof.

In some embodiments, the conductive transparent material is deposited using a technique selected from the group consisting of CVD, MOCVD, PECVD, HWCVD, sputtering, evaporation, and combinations thereof. The layer of conductive material 205 can also be deposited by these and other similar such methods.

In some embodiments, the present invention is directed to a system or assembly comprising the above-described photovoltaic device(s) 100 and/or 200. Devices 100 and/or 200 can be integrated into a solar panel, for example. Depending on the size of the device and the intended use, any number from a single PV device to multiple such devices connected in series or parallel may be used.

In some embodiments, the photovoltaic device(s) 100 and/or 200 are operable for use in applications including, but not limited to, commercial building integrated PV systems in which the PV modules containing the described photovoltaic device(s) 100 and/or 200 are placed on the roof of a home, a rural PV system, grid-connected home PV systems in which the PV modules containing the described photovoltaic device(s) 100 and/or 200 are placed on the roof of a home, power systems for commercial and/or military electronics, and the like.

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

Example 1

This Example serves to illustrate formation of a conformal layer of amorphous Si on crystalline Si nanowires (formed by an wet etching process), in accordance with some embodiments of the present invention.

Figure 6:
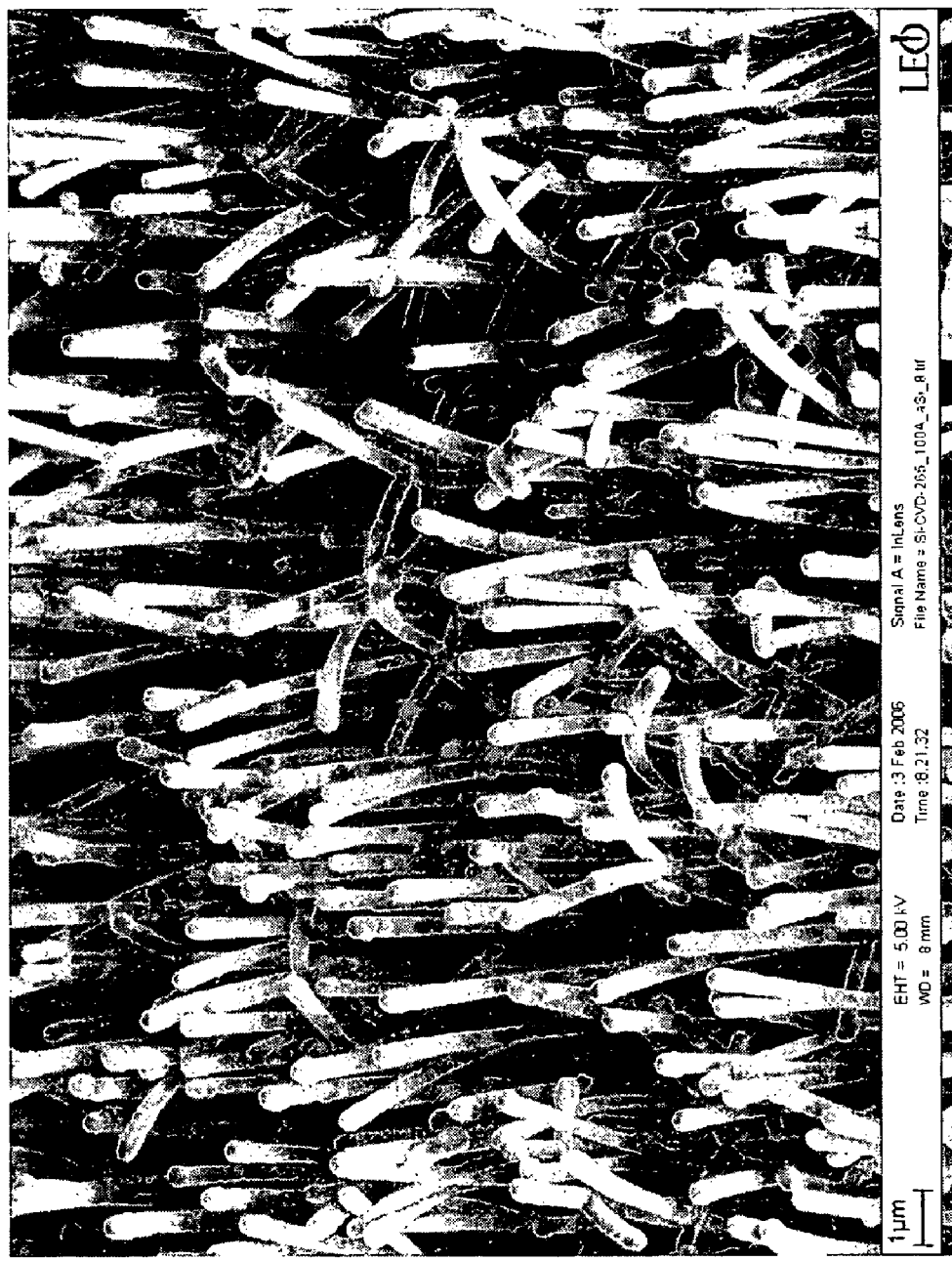
FIG. 6 is a scanning electron microscopy (SEM) micrograph of a conformal amorphous Si layer on a Si nanowire array formed via an etching technique.
Figure 7:
FIG. 7 is a higher magnification view of a region shown in FIG. 6.

A silicon wafer is bonded to a piece of metal foil or a metallized glass wafer using standard metallurgical bonding methods. The wafer is then thinned to a desired thickness in a standard Si etchant such as a mixture of hydrofluoric, acetic, and nitric acids. Once the desired thickness is reached, typically being 5 μm to 20 μm, the nanowires (representative elongated nanostructures) are formed in the silicon by immersion in a silver nitrate/hydrofluoric acid solution. The conformal i-n junction is formed by plasma-enhanced chemical vapor deposition (PECVD), followed by deposition of a top transparent conducting oxide (TCO). A via is established for backside contact and final top and bottom contacts are formed by a shadow mask deposition process. FIGS. 6 and 7 are scanning electron microscopy images of conformal amorphous Si layer on a Si nanowire array that has been formed via such an etching technique, FIG. 7 being a more highly magnified region of FIG. 6.

Example 2

This Example serves to illustrate formation of a conformal layer of amorphous Si on CVD-grown crystalline Si nanowires, in accordance with some embodiments of the present invention.

Silicon nanowires are grown on a conductive substrate material such as stainless steel foil, or a doped ZnO-coated glass wafer, after deposition of a suitable catalyst thin film or nanoparticle layer. In one such embodiment, a nanoporous template layer is first established on top of the back contact material by anodization and then a catalyst is placed within the pores of the template electrochemically. Once the nanowires are grown, the conformal i-n junction is formed by plasma-enhanced chemical vapor deposition (PE-CVD), followed by deposition of a top transparent conducting oxide (TCO). An example of a thick amorphous silicon layer deposited on CVD-grown Si nanowires is shown in FIGS. 8 and 9.

Figure 8:
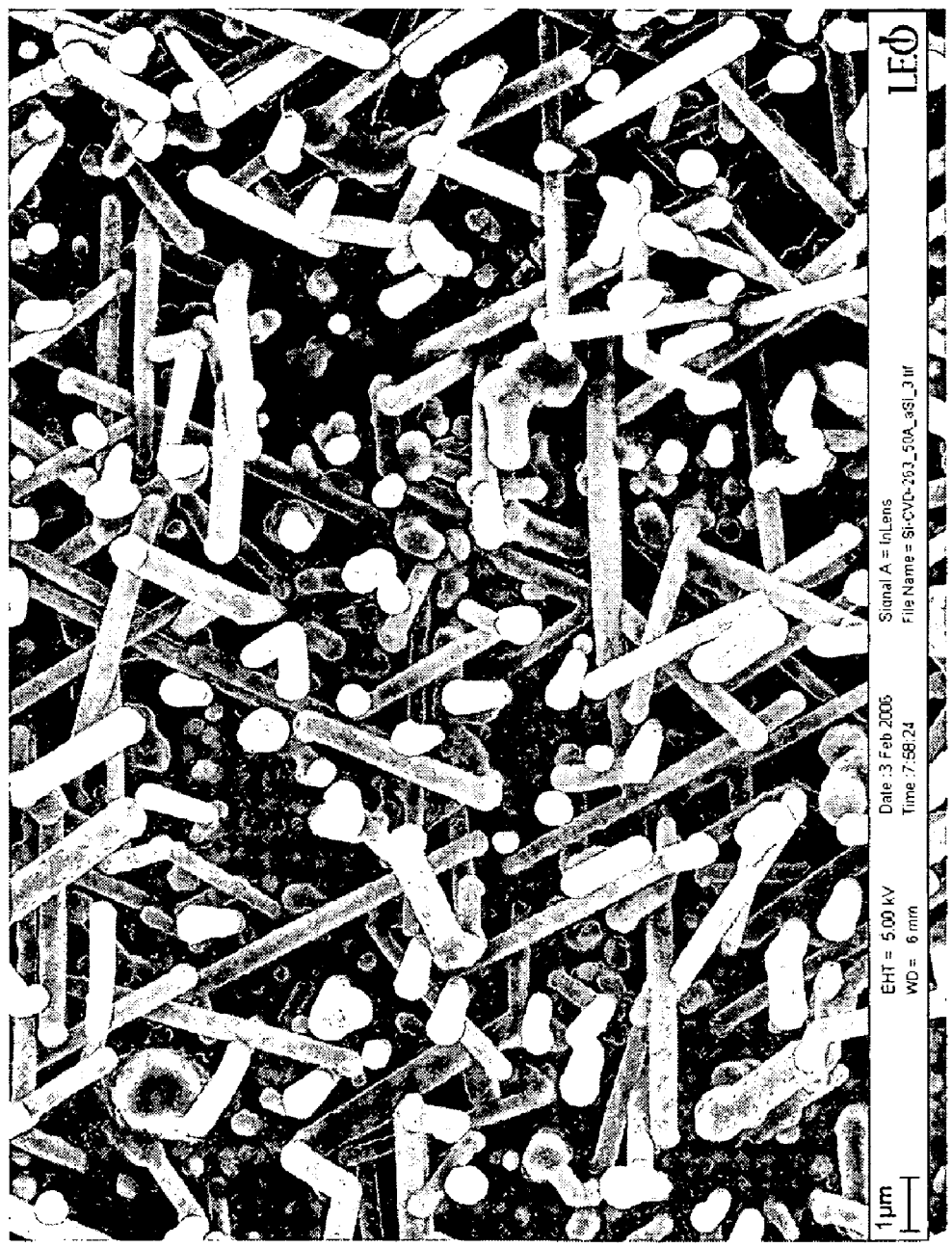
FIG. 8 is a scanning electron micrograph of a conformal amorphous Si layer on a Si nanowire array formed via chemical vapor deposition (CVD)
Figure 9:
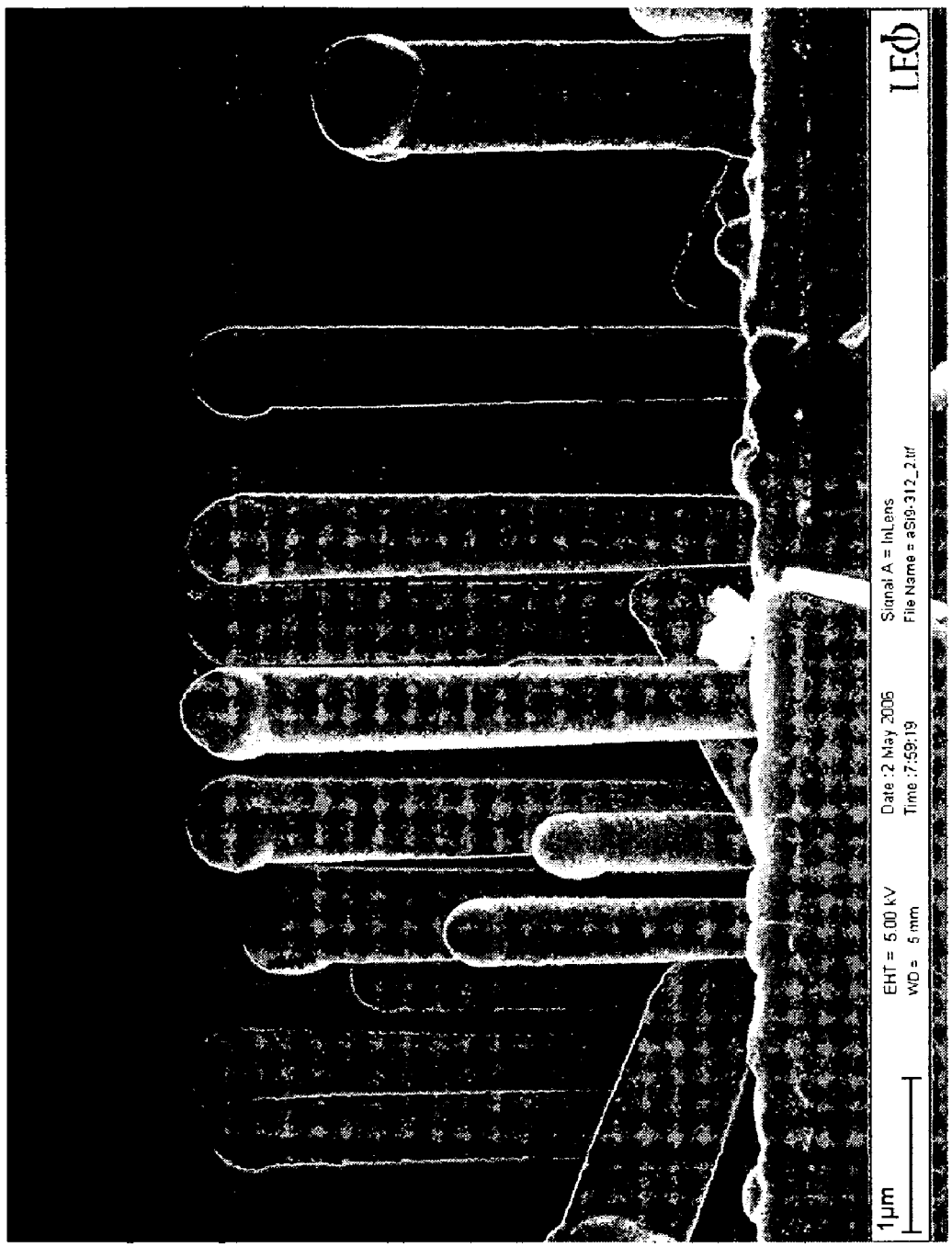
FIG. 9 is a higher magnification view of a region shown in FIG. 8.

FIGS. 8 and 9 are scanning electron microscopy images of conformal amorphous Si layer on a Si nanowire array that has been formed via such CVD technique, FIG. 9 being a more highly magnified region of FIG. 8. Vias are established for backside contact and final top and bottom contacts are formed by a shadow mask deposition process.

Example 3

This Example serves to illustrate an exemplary system comprising photovoltaic devices 100, in accordance with some embodiments of the present invention.

The photovoltaic device(s) 100 and/or 200 can be packaged in a photovoltaic module such that they are physically isolated from the environment. The module front surface is made of glass to allow sunlight to penetrate, and electrical leads are established on the backside for incorporation into a PV power system. In one embodiment, the photovoltaic device 100/200 is grown on a large glass substrate with an intermediate doped ZnO layer such that the glass substrate becomes the protecting glass for the PV module, the original growth layer for the nanowires now being the "front contact" (in terms of the direction in which it is illuminated). Corresponding "backside contact" is then established at the original top surface of the elongated nanostructure layer.

Example 4

This Example serves to illustrate how a nanowire solar cell, in accordance with embodiments of the present invention can reduce light reflectance, thereby making the solar cell more efficient (relative to traditional planar solar cells)

Figure 10:
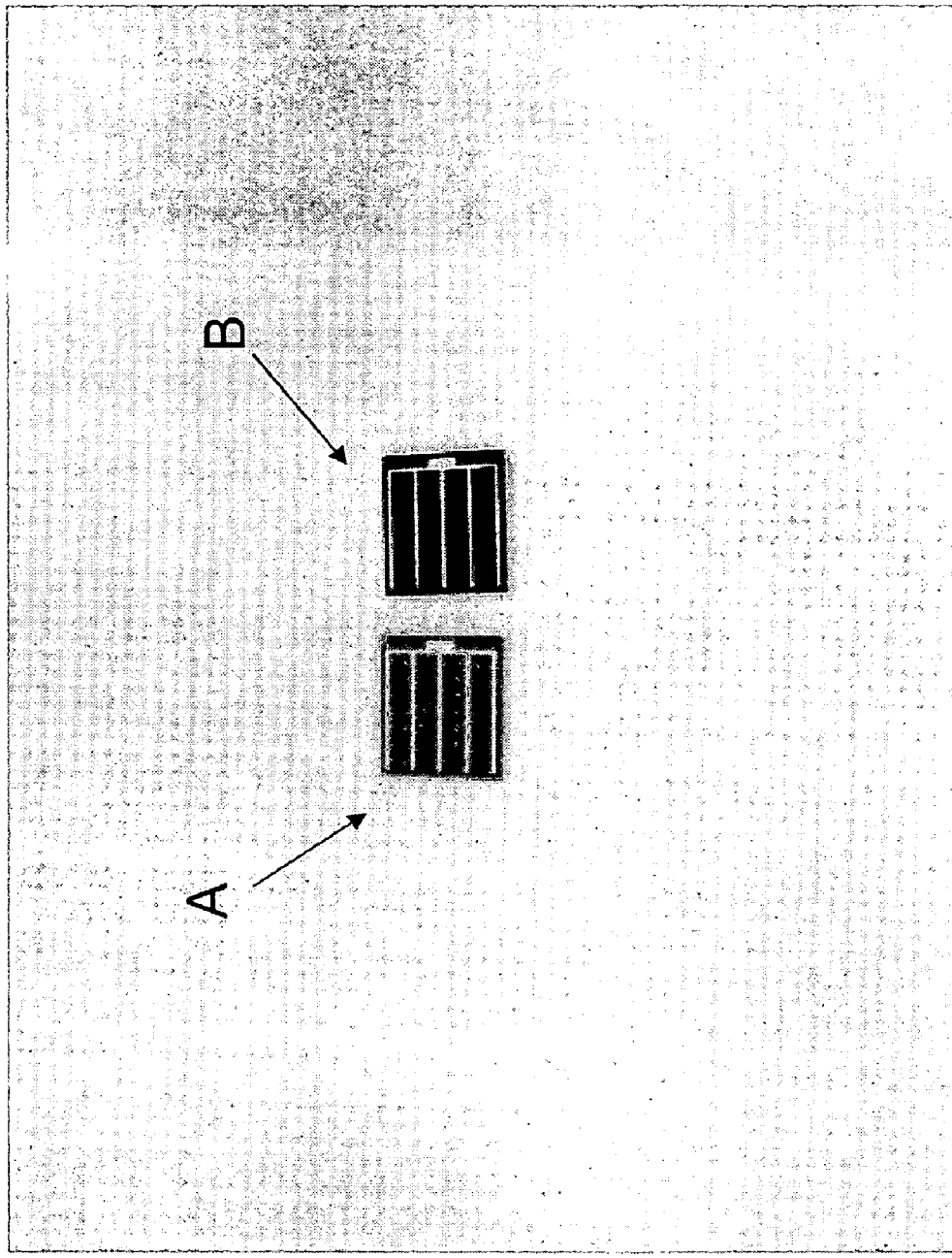
FIG. 10 is a optical view of a planar solar cell (A) and a nanowire solar cell (B), each having dimensions of 1 cm on each side, the nanowire solar cell appearing darker because it is less reflective.
Figure 11:
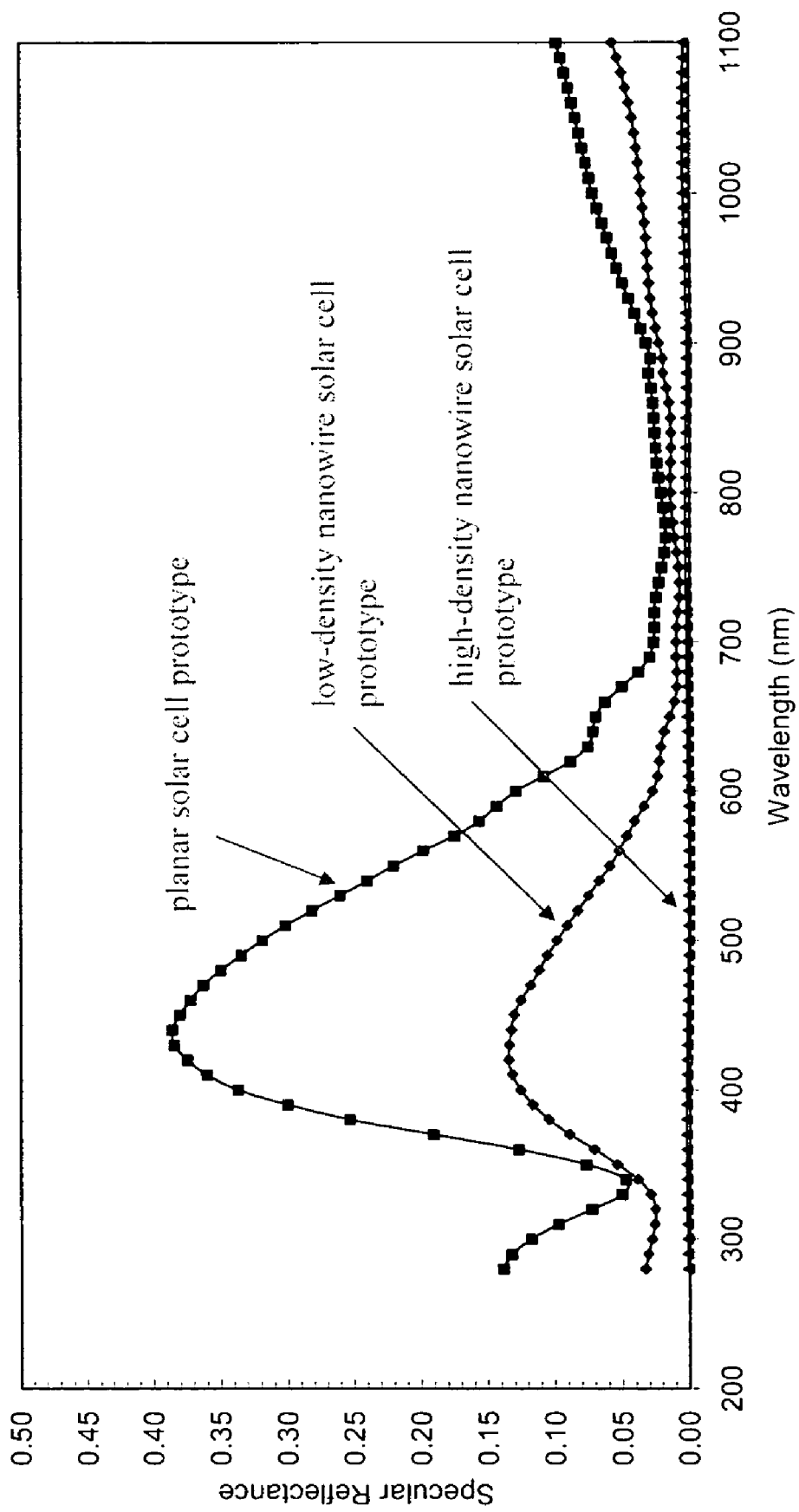
FIG. 11 depicts specular reflection as a function of wavelength for a planar solar cell (■), a low-density nanowire solar cell (♦), and a high-density nanowire solar cell (▲)

FIG. 10 depicts an optical image of a traditional planar solar cell (A) and a nanowire solar cell (B). The nanowire solar cell is visibly less reflective. FIG. 11 quantifies such specular reflection as a function of wavelength over the range of 300-1100 nm.

Figure 12:
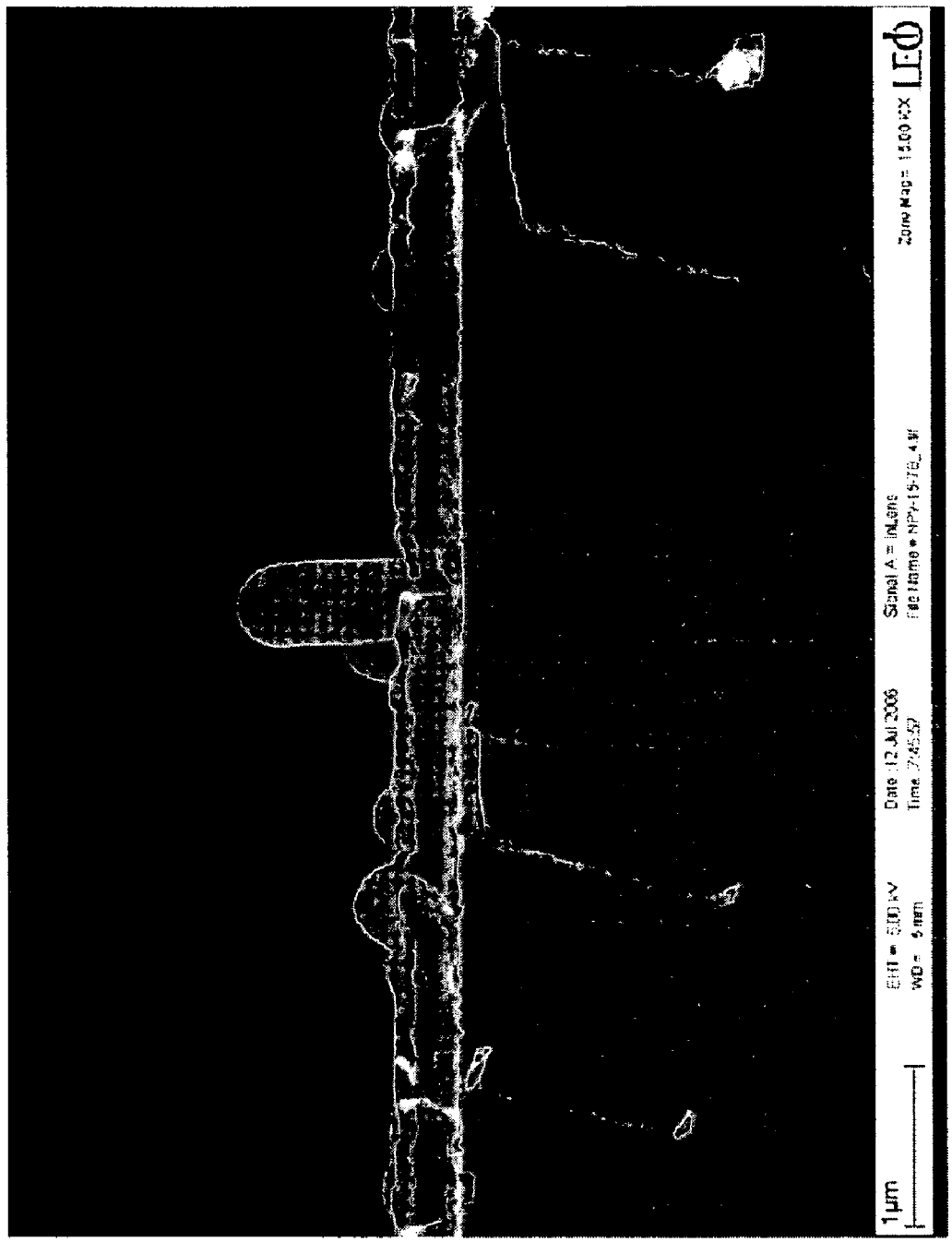
FIG. 12 is a side-view scanning electron micrograph of a thin film solar cell comprising Si nanowires, in accordance with some embodiments of the present invention.
Figure 13:
FIG. 13 is a plan-view scanning electron micrograph of a thin film solar cell comprising Si nanowires, in accordance with some embodiments of the present invention.

FIG. 12 is a side-view scanning electron micrograph of a low density thin film nanowire solar cell comprising Si nanowires and a ITO coating on a degenerately-doped Si substrate (such as is seen in FIG. 10(B)), in accordance with some embodiments of the present invention. FIG. 13 is a plan-view scanning electron micrograph of a like thin film solar cell.

Example 5

This Example serves to illustrate an exemplary application in which photovoltaic device(s) 100 and/or 200 may find use, in accordance with some embodiments of the present invention.

Photovoltaic modules containing photovoltaic device(s) 100 and/or 200 are typically mounted onto the roofs of homes for grid-connected power generation. The modules are mounted by several methods to yield functional and aesthetic qualities. The module provides power that may be stored or sold back to the electric company for a profit, as is currently done with standard residential solar cell modules. The solar cells may be cut into standard sizes and mounted in a module frame and connected in series using standard solder-based interconnect schemes, in some cases with bypass diodes to minimize shading effects. In cases where the nanowires are grown on a transparent material, the full glass substrate may be directly used in the framed module, or the glass may be laminated and used as the module without the need for a frame. In this case, a laser scribing method typically known in the art may be used for front and backside contact to interconnect solar cell segments in series.

Variations

Figure 14:
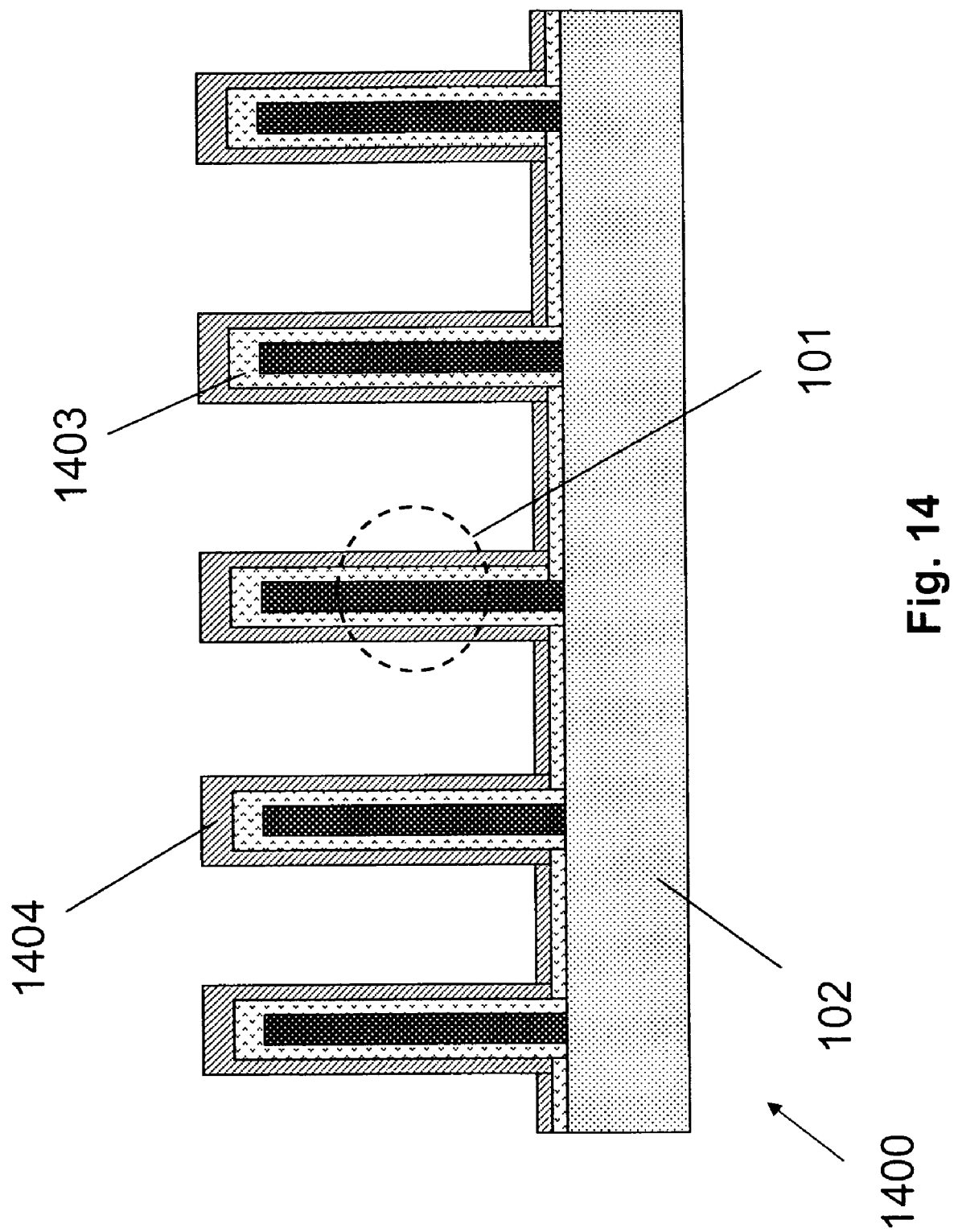
FIG. 14 depicts a variation on the conformal coatings depicted in FIGS. 1 and 2.

While conformal coatings have been illustrated in FIGS. 1 and 2 depicting a substantial filling of the void space between adjacent nanowires with the conformal layer material, such conformal coatings may also resemble those depicted in FIG. 14, wherein partially constructed device 1400 comprises nanowires 101 on substrate 102 and a first conformal layer (coating) 1403 and second conformal layer 1404 disposed on the nanowires.

While Si nanowires have been used in many of the embodiments described above, they are merely representative of a larger class of semiconductor-based elongated nanostructures. Accordingly, as will be recognized by one of skill in the art, many of the above-described embodiments can be varied to include elongated nanostructures comprising materials other than silicon. Such variant embodiments would have correspondingly different (from silicon) conformal layers. Additionally, for some of the above-described embodiments, conformal layers comprising an intrinsic material can include A-SiGe:H.

SUMMARY

In summary, the present invention is directed to photovoltaic (PV) devices comprising silicon (Si) nanowires as active PV elements, wherein such devices are typically thin film Si solar cells: Generally, such solar cells are of the p-i-n type. Additionally, the present invention is also directed at methods of making and using such devices, and to systems employing such devices. By providing crystalline Si nanowires in an amorphous Si matrix, the path of the holes is dramatically reduced, thereby increasing hole collection and corresponding device efficiency. Embodiments described herein build upon the prior art amorphous silicon solar cells by providing an efficient path for electrical charge carriers in the nanowires, while simultaneously providing improved optical properties.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A photovoltaic device comprising:
    a) a plurality of crystalline Si nanowires grown directly on an electrically conductive substrate and disposed in a substantially vertical orientation on the substrate, the Si nanowires having a doping of a first type;
    b) a first conformal Si layer of amorphous intrinsic silicon disposed conformally on the plurality of crystalline Si nanowires, such that the first conformal Si layer effectively absorbs a majority of light impinging on the photovoltaic device;
    c) a second conformal amorphous Si layer disposed conformally on the first conformal Si layer, the second conformal amorphous Si layer having a doping of a second type, thereby providing for a charge separating junction;

d) a conductive material layer disposed on the second conformal Si layer; and e) top and bottom contacts operable for connecting the device to an external circuit, wherein the bottom contact is in electrical contact with the plurality of nanowires and the top contact is in electrical contact with the second conformal Si layer.

2. The photovoltaic device of claim 1, further comprising a nanoporous template, residing on, or integral with, the substrate, and from which the Si nanowires emanate.

3. The photovoltaic device of claim 1, wherein the substrate is transparent.

4. The photovoltaic device of claim 1, wherein the Si nanowires are p-doped.

5. The photovoltaic device of claim 1, wherein the second conformal Si layer is n-doped.

6. The photovoltaic device of claim 1, wherein the conductive material layer is a metal, and wherein the conductive material layer comprises a thickness between about 50 nm and about 2 μm.

7. The photovoltaic device of claim 1, wherein the conductive material layer is transparent, and wherein the conductive material layer comprises a thickness between about 50 nm and about 200 nm.

8. The photovoltaic device of claim 1, wherein the conductive material layer provides for the top contact.

9. A photovoltaic device comprising:

a) a plurality of crystalline Si nanowires grown directly on an electrically conductive substrate and disposed in a substantially vertical orientation on the substrate, the Si nanowires having a doping of a first type;

b) a first conformal Si layer of amorphous intrinsic silicon disposed conformally about the plurality of crystalline Si nanowires, and substantially occupying any void space between the plurality of nanowires such that the first conformal Si layer effectively absorbs a majority of light impinging on the photovoltaic device;

c) a second conformal amorphous Si layer of semiconducting material disposed conformally about the first conformal amorphous Si layer, the second conformal Si layer having a doping of a second type, thereby providing for a charge separating junction;

d) a conductive transparent material disposed on the second conformal Si layer; and e) top and bottom contacts operable for connecting the device to an external circuit, wherein the bottom contact is in electrical contact with the plurality of nanowires and the top contact is in electrical contact with the second conformal Si layer.

10. The photovoltaic device of claim 9, further comprising a nanoporous template, residing on, or integral with, the substrate, and from which the Si nanowires emanate.

11. The photovoltaic device of claim 9, wherein the nanowires have a diameter between about 5 nm and about 1 μm, and wherein the nanowires have a length between about 100 nm and about 100 μm.

12. The photovoltaic device of claim 9, wherein the Si nanowires are n-doped.

13. The photovoltaic device of claim 9, wherein the substrate comprises a material selected from the group consisting of amorphous Si, amorphous SiGe, and amorphous SiC.

14. The photovoltaic device of claim 9, wherein the substrate comprises a conductive layer that serves as the bottom contact, and wherein the conductive layer comprises a material selected from the group consisting of Au, Ti, W, Co, Ta2N and TiN.

15. The photovoltaic device of claim 9, wherein the substrate comprises a transparent conductive oxide material.

16. The photovoltaic device of claim 15, wherein the transparent conductive oxide material is indium-tin-oxide (ITO).

17. The photovoltaic device of claim 9, wherein the bottom contact comprises a material that is transparent, thereby providing for backside illumination.

18. The photovoltaic device of claim 17, wherein the material of which the bottom contact is comprised is doped ZnO.

19. The photovoltaic device of claim 9, wherein the second conformal layer is n-doped.

20. The photovoltaic device of claim 10, wherein the template is anodized aluminum oxide (AAO).

21. The photovoltaic device of claim 9, wherein the conductive transparent material is a transparent conductive oxide.

22. The photovoltaic device of claim 9, wherein the transparent conductive oxide is indium-tin-oxide (ITO).

23. A photovoltaic device comprising:

a) a plurality of crystalline Si nanowires grown directly on an electrically conductive transparent substrate and disposed in a substantially vertical orientation on the transparent substrate, wherein the Si nanowires have a doping of a first type, and wherein the transparent substrate comprises at least one region that is conductive;

b) a first conformal Si layer of amorphous intrinsic silicon disposed conformally about the plurality of crystalline Si nanowires, and substantially occupying any void space between the plurality of nanowires such that the first conformal Si layer effectively absorbs a majority of light impinging on the photovoltaic device;

c) a second conformal amorphous Si layer of semiconducting material disposed conformally on the first conformal amorphous Si layer, the second conformal Si layer having a doping of a second type, thereby providing for a charge separating junction; and d) a conductive material layer disposed on the second conformal Si layer such that the transparent conductive substrate and the conductive material layer provide top and bottom contacts for the device.

24. The photovoltaic device of claim 23, wherein the transparent substrate comprises a conductive layer.

25. The photovoltaic device of claim 23, further comprising a nanoporous template, residing on, or integral with, the substrate, and from which the Si nanowires emanate.

26. The photovoltaic device of claim 23, wherein the nanowires have a diameter between about 5 nm and about 1 μm, and wherein the nanowires have a length between about 100 nm and about 100 μm.

27. The photovoltaic device of claim 23, wherein the Si nanowires are p-doped.

28. The photovoltaic device of claim 23, wherein the substrate comprises a transparent conductive oxide material.

29. The photovoltaic device of claim 24, wherein the transparent conductive oxide material is selected from the group consisting of indium-tin-oxide (ITO) and ZnO.

30. The photovoltaic device of claim 23, wherein the second conformal layer is n-doped.

31. The photovoltaic device of claim 25, wherein the template is anodized aluminum oxide (AAO).

32. The photovoltaic device of claim 23, wherein the conductive material layer is selected from the group consisting of Mo, Al, Cu, Ag, Ti, and combinations thereof.

33. A photovoltaic device comprising:
a) a plurality of elongated crystalline Si nanostructures grown directly on an electrically conductive transparent substrate and disposed in a substantially vertical orientation on the substrate, the elongated crystalline Si nanostructures having a doping of a first type;
b) a first conformal Si layer of amorphous intrinsic silicon material disposed conformally on the plurality of elongated crystalline Si nanostructures, such that the first conformal layer effectively absorbs a majority of light impinging on the photovoltaic device;
c) a second conformal amorphous Si layer of semiconducting material disposed conformally on the first conformal amorphous Si layer, the second conformal layer having a doping of a second type, thereby providing for a charge separating junction;
d) a conductive material layer disposed on the second conformal layer such that the transparent conductive substrate and the conductive material layer provide top and bottom contacts operable for connecting the device to an external circuit, wherein the bottom contact is in electrical contact with the plurality of elongated semiconductor nanostructures and the top contact is in electrical contact with the second conformal layer.

34. A solar panel comprising at least one photovoltaic device of claim 1, wherein the solar panel isolates such devices from their surrounding atmospheric environment and permits the generation of electrical power.

35. A solar panel comprising at least one photovoltaic device of claim 9, wherein the solar panel isolates such devices from their surrounding atmospheric environment and permits the generation of electrical power.

36. A solar panel comprising at least one photovoltaic device of claim 23, wherein the solar panel isolates such devices from their surrounding atmospheric environment and permits the generation of electrical power.

37. A solar panel comprising at least one photovoltaic device of claim 33, wherein the solar panel isolates such devices from their surrounding atmospheric environment and permits the generation of electrical power.

* * * * *

UNITED STATES PATENT AND TRADEMARK OFFICE
CERTIFICATE OF CORRECTION

PATENT NO. : 7,893,348 B2  
APPLICATION NO. : 11/509886  
DATED : February 22, 2011  
INVENTOR(S) : Korevaar et al.

Page 1 of 1

It is certified that error appears in the above-identified patent and that said Letters Patent is hereby corrected as shown below:

In Column 12, Line 30, delete "cells:" and insert -- cells. --, therefor.

In Column 15, Line 8, in Claim 33, delete "material" before "disposed".

Signed and Sealed this  
Nineteenth Day of July, 2011

David J. Kappos  
*Director of the United States Patent and Trademark Office*